United States Patent
Widodo et al.

(10) Patent No.: US 7,524,755 B2
(45) Date of Patent: Apr. 28, 2009

(54) ENTIRE ENCAPSULATION OF CU INTERCONNECTS USING SELF-ALIGNED CUSIN FILM

(75) Inventors: Johnny Widodo, Singapore (SG); Bei Chao Zhang, Singapore (SG); Tong Qing Chen, Singapore (SG); Yong Kong Siew, Sungai Pelek (SG); Fan Zhang, Singapore (SG); San Leong Liew, Singapore (SG); John Sudijono, Singapore (SG); Liang Choo Hsia, Singapore (SG)

(73) Assignee: Chartered Semiconductor Manufacturing, Ltd., Singapore (SG)

( * ) Notice: Subject to any disclaimer, the term of this patent is extended or adjusted under 35 U.S.C. 154(b) by 57 days.

(21) Appl. No.: 11/358,934

(22) Filed: Feb. 22, 2006

(65) Prior Publication Data

US 2007/0197023 A1   Aug. 23, 2007

(51) Int. Cl.
*H01L 21/4763* (2006.01)
(52) U.S. Cl. .................. 438/627; 438/643; 438/687; 257/E21.584
(58) Field of Classification Search ................ 438/621, 438/625, 627, 642–643, 687
See application file for complete search history.

(56) References Cited

U.S. PATENT DOCUMENTS

| | | | |
|---|---|---|---|
| 6,150,270 A * | 11/2000 | Matsuda et al. | 438/687 |
| 6,406,996 B1 * | 6/2002 | Bernard et al. | 438/653 |
| 6,803,300 B2 * | 10/2004 | Higashi et al. | 438/598 |
| 7,056,826 B2 * | 6/2006 | Wu et al. | 438/627 |
| 2003/0054631 A1 * | 3/2003 | Raaijmakers et al. | 438/633 |
| 2003/0073301 A1 | 4/2003 | Nguyen | |
| 2003/0201539 A1 * | 10/2003 | Matsunaga et al. | 257/758 |
| 2003/0214043 A1 | 11/2003 | Saitoh | |
| 2004/0115933 A1 | 6/2004 | Jung | |
| 2005/0158999 A1 | 7/2005 | Lin | |
| 2005/0194683 A1 | 9/2005 | Yu | |
| 2007/0035029 A1 * | 2/2007 | Caubet et al. | 257/762 |

OTHER PUBLICATIONS

Chhun et al., "Impact of introducing CuSiN self-aligned barrier in advanced copper interconnects", Aug. 18, 2005, Microelectronic Engineering, vol. 82, pp. 587-593.*

Gosset et al., "Integration and performances of an alternative approach using copper silicide as a self-aligned barrier for 45 nm technology node Cu interconnects", Jul. 2004, The Proceedings of the 2004 International Interconnect Technology Conference 2004, pp. 15-17.*

Usami et al., "Highly Reliable Interface of Self-aligned CuSiN process with Low-k SiC barrier dielectric (k=3.5) for 65 nm node and beyond", Jun. 7, 2006, IEEE International Interconnect Technology Conference 2006, pp. 125-127.*

(Continued)

*Primary Examiner*—Alexander G Ghyka
*Assistant Examiner*—Reema Patel
(74) *Attorney, Agent, or Firm*—Horizon IP Pte Ltd

(57) ABSTRACT

A method of forming a barrier layer and cap comprised of CuSiN for an interconnect. We provide an interconnect opening in a dielectric layer over a semiconductor structure. We form a CuSiN barrier layer over the sidewalls and bottom of the interconnect opening by reacting with the first copper layer. We then form an interconnect over the CuSiN layer filling the interconnect opening. We can form a CuSiN cap layer on the top surface of the interconnect.

18 Claims, 1 Drawing Sheet

OTHER PUBLICATIONS

Gosset et al., "Integration and performances of an alternative approach using copper silicide as a self-aligned barrier for 45 nm technology node Cu interconnects", Jun. 9, 2004, Interconnect Technology Conference, 2004, Proceedings of the IEEE, pp. 15-17.*

LS. Gosset, V. Arnal, S. Chhun, N. Casanova, M. Mellier, J.Ph. Reynard, X. Federspiel, J-F Guilaumond, L. Arnaud, J. Torres, sildes title. Integration and Characterization of a self aligned barrier to Cu diffusion based on copper silicide, apparently Advance metallization conferences (AMC) 2003.

* cited by examiner

ENTIRE ENCAPSULATION OF CU INTERCONNECTS USING SELF-ALIGNED CUSIN FILM

BACKGROUND OF INVENTION

1) Field of the Invention

This invention relates generally to fabrication of semiconductor devices and more particularly to the formation of barrier layer for interconnects and more particularly for formation of a copper and silicon and nitrogen containing barrier layer.

2) Description of the Prior Art

Copper metallization is increasingly being used for advanced semiconductor device integrated circuit fabrication including semiconductor features having sub-quarter micron linewidths and high aspect ratios to larger features such as bonding pads. Copper and its alloys have lower resistivity and better electromigration resistance compared to other metals such as, for example, aluminum. These characteristics are critical for achieving device reliability together with higher current densities and increased signal propagation speed. While several processing difficulties related to forming copper semiconductor features have been overcome, several problems remain, especially in the areas of current leakage between copper interconnects and the increased tendency of copper to electro-migrate through low-k porous dielectric insulating layers.

In forming a copper semiconductor feature, typically a relatively pure (undoped) copper material is deposited to fill an anisotropically etched opening, to form, for example a copper damascene or dual damascene structure. Copper electro-chemical plating (ECP) is a preferable method for depositing copper to achieve superior step coverage of sub-micron etched features. The deposited copper layer is then planarized to remove excess copper overlying the feature level by chemical mechanical polishing (CMP).

One problem affecting copper metallization is the tendency of copper to easily form oxides of copper, for example $CuO$ or $CuO_2$, upon exposure to oxidizing environments including humid environments. According to prior art processes, following the copper CMP process the exposed copper is protected by depositing overlying layers and/or storing in controlled environments to prevent copper oxidation. The formation of copper oxides increases the electrical resistance of the interconnect lines and reduces adhesion of overlying deposited layers. To form the next level of the device, a metal nitride layer which functions as an etching stop layer in formation of metal interconnect features such as vias or dual damascenes in overlying dielectric insulating layers, is typically deposited over the exposed copper following a CMP process. The overlying etching stop layer is also intended to act to prevent further copper oxidation and to reduce electromigration of copper.

The dual goals of preventing copper electro-migration and preventing cross-interconnect current leakage have not been adequately solved for several reasons. For example, porous silicon oxide based low-K dielectric insulating layers having an interconnecting porous structure have exhibited reduced adhesion to overlying layers, for example etch stop layers, and have increased the tendency of integrated circuit damascene features, such as copper interconnects, to exhibit increased current leakage and electro-migration of copper ions. For example, a phenomenon known as time dependent dielectric breakdown (TDDB) is believed to result from charge accumulation due to slow current leakage over time along micro-cracks in the low-K dielectric insulating layers and along cracks developed along poorly adhering material interfaces. As low-K materials become even more porous in an effort to achieve lower the dielectric constants, they have coincidentally become increasing mechanically weak, frequently resulting in micro-cracking and poor adhesion at material interfaces thereby increasing both current leakage and Cu electromigration. As a result, electrical performance and device reliability of semiconductor devices is compromised.

Thus, there is a continuing need for novel semiconductor micro-circuitry manufacturing methods to improve the electrical performance of copper interconnect features including methods to reduce copper oxidation, improve adhesion of overlying layers, and to mechanically strengthen low-K dielectric insulating layers while maintaining low dielectric constants.

The importance of overcoming the various deficiencies noted above is evidenced by the extensive technological development directed to the subject, as documented by the relevant patent and technical literature. The closest and apparently more relevant technical developments in the patent literature can be gleaned by considering the following.

US20050158999A1: Multi-step plasma treatment method to improve CU interconnect electrical performance—Plasma treating exposed copper surface and dielectric insulating layer for forming copper damascene structures, involves first plasma treatment with reduction gas and nitriding gas, and second plasma treatment with oxidizing gas—Inventor: Lin, Keng-Chu; Ping US20050194683A1: Bonding structure and fabrication thereof—Inventor: Yu, Chen-Hua;—appears to show copper nitride protection layer on copper interconnect.

US20040115933A1: Jung—Methods of manufacturing a semiconductor device—Manufacture of semiconductor device, e.g. logic device, by filling contact hole with copper layer, planarizing, removing copper oxide layer, depositing copper barrier layer and upper insulating layer, and forming upper contact hole.

US20030214043A1: Semiconductor device—Semiconductor device comprises interconnect having second conductor film, e.g. titanium silicon nitride, being formed by chemical vapor deposition or atomic layer deposition Inventor: Saitoh, Toshio;

US20030073301A1: Multilayered diffusion barrier structure for improving adhesion property—Forming multi-layered diffusion barrier structure to improve adhesion between underlayer and deposited conducting layer by forming poorly electrical conducting adhesion-promoter layer over conducting diffusion barrier layer Inventor: Nguyen, Tue; Fremont, Calif., United L S. Gosset, V. Arnal, S. Chhun, N. Casanova, M. Mellier, J. Ph. Reynard, X. Federspiel, J-F Guilaumond, L. Arnaud, J. Torres, sildes title. Integration and Characterization of a self aligned barrier to Cu diffusion based on copper silicide, apparently Advance metallization conferences (AMC) 2003.

SUMMARY OF THE INVENTION

The example embodiments of the present invention provides a structure and a method of manufacturing a interconnect structure with a barrier layer comprised of CuSiN which is characterized as follows.

An example embodiment comprises a method of forming a barrier layer for an interconnect comprising the steps of:

providing an interconnect opening in a dielectric layer over a semiconductor structure;

forming a barrier layer comprised of CuSiN over the sidewalls and bottom of said interconnect opening;
forming an interconnect over said barrier layer.

In an option, a cap layer comprised of CuSiN is formed over the interconnect.

Another example embodiment comprises a device structure comprising:
an interconnect opening in a dielectric layer over a semiconductor structure;
a barrier layer comprised of CuSiN over the sidewalls and bottom of said interconnect opening;
an interconnect over said barrier layer.

In an option, a cap layer comprised of CuSiN is over the interconnect.

The above and below advantages and features are of representative embodiments only, and are not exhaustive and/or exclusive. They are presented only to assist in understanding the invention. It should be understood that they are not representative of all the inventions defined by the claims, to be considered limitations on the invention as defined by the claims, or limitations on equivalents to the claims. For instance, some of these advantages may be mutually contradictory, in that they cannot be simultaneously present in a single embodiment.

Similarly, some advantages are applicable to one aspect of the invention, and inapplicable to others. Furthermore, certain aspects of the claimed invention have not been discussed herein. However, no inference should be drawn regarding those discussed herein relative to those not discussed herein other than for purposes of space and reducing repetition. Thus, this summary of features and advantages should not be considered dispositive in determining equivalence. Additional features and advantages of the invention will become apparent in the following description, from the drawings, and from the claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE EXAMPLE EMBODIMENTS

Figure 2:
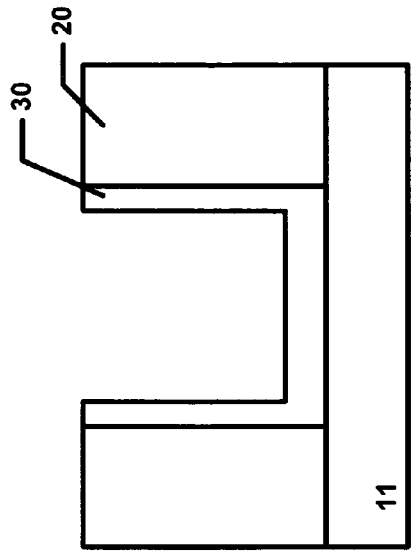
FIGS. 1 through 4 are cross sectional views for illustrating a method for manufacturing an interconnect according to an example embodiment of the present invention.

In an exemplary embodiment, referring to FIGS. 1-4, are shown cross sectional views of a portion of a multi-level semiconductor device at stages in an interconnect manufacturing process.

A. Provide an Interconnect Opening in a Dielectric Layer over a Semiconductor Structure Referring to FIG. 1, we provide an interconnect opening 24 in a dielectric layer 20 over a semiconductor structure 11.

The semiconductor structure 11 can comprise a substrate with devices (e.g., FETs) formed within and thereon. The substrate can be a semiconductor substrate, such as a silicon wafer or a SOI substrate. The dielectric layer 20 can be a interlevel dielectric (ILD) layer or inter metal dielectric (IMD) layer. The dielectric layer 20 can have a thickness between 3000 and 6000 angstroms. The dielectric layer can be comprised of a low K dielectric such as SiCOH.

The interconnect opening 24 can expose a conductive structure, such as a lower level interconnect or contact. The interconnect opening can have other shapes, such as a dual damascene shape.

B. Form a First Copper Layer over the Sidewalls and Bottom of the Interconnect Opening and over the Dielectric Layer and Semiconductor Structure We form a first copper layer 26 over the sidewalls and bottom of the interconnect opening 24 and over the dielectric layer 20 and semiconductor structure 11. The copper layer is preferably essentially comprised of copper.

The first copper layer can have a thickness between 20 and 200 angstroms and more preferably less than 50 angstroms.

The first Cu layer 26 can be formed using a electrografting, ALD, or other layered deposition process. The deposition process is preferably performed at low temperature between about 25 C. and 100 C. with preferably at near room temperature The thickness of the first Cu layer is preferably determined by the thickness of the subsequently formed CuSiN layer 30. Preferably, the first copper layer 26 has to be thick enough to provide Cu for the formation of the CuSiN layer. Also, in a preferred embodiment all of the copper layer is consumed in the formation of the CuSiN layer.

C. Forming a CuSiN Layer over the Sidewalls and Bottom of the Interconnect Opening by Reacting with the First Copper Layer We form a CuSiN (copper silicon nitride) (barrier) layer 30 over the sidewalls and bottom of the interconnect opening 24 by reacting with the first copper layer 26. The barrier layer 30 is preferably consists essentially of CuSiN (copper silicon nitride).

The CuSiN layer 30 is preferably formed by at least a two step process comprised of a 1) soaking process in a silicon containing gas and 2) a N-containing plasma treatment.

In the first step, we can perform a soaking process in a silicon containing gas such as SiH4, 3MS (TriMethyl Silane) or 4MS (Tetra Methyl Silane) and a nitrogen containing gas such as $NH_3$. The soak forms a copper silicide layer.

An example soak process comprises: in SiH4 soak process: a $SiH_4$ flow between about 50 and 250 sccm; Soak time between about 5 and 30 s; a $N_2$ flow between about 0 and 16000 sccm; temperature range between about 200 and 350 C; and a pressure range about between 3 and 6 torr.

Some possible alternate Si containing gases to $SiH_4$ are 3MS or 4MS.

An example, N-containing plasma step comprises: a $NH_3$ plasma treatment following the $SiH_4$ soak: with a $NH_3$ flow between about 150 and 1600 sccm; a plasma treatment time between about 5 and 30 s; RF power between about 500 and 700 W; a temperature range between about 200 and 350 C; pressure range between about 3 and 6 torr ; a $N_2$ flow between about 150 and 1600 sccm.

In a preferred embodiment, the whole Cu layer 26 is reacted and converted into CuSiN as barrier layer 30. This allows for a thinner CuSiN barrier layer that lowers the resistance of the barrier layer and increases the gapfill capability on the small trenches.

The CuSiN barrier layer can be comprised of Cu between 20 and 60 atomic %, Si between 25 and 45 atomic % and N between 5 and 20 atomic %. With preferred combination of about 55 atomic % Cu, 30 atomic % Si and 15 atomic % N D. Form an Interconnect over the CuSiN Layer Filling the Interconnect Opening Referring to FIG. 3, we form an interconnect 36 over the CuSiN layer 30 filling the interconnect opening.

The interconnect 36 can be comprised of a conductive material, such as but not limited to metals and metal alloys, Cu, Cu alloys doped Cu, Cu doped with Ag, Al, Ag, and alloys thereof. Preferably the interconnect 36 can be consist essentially of copper or be comprised of copper alloy, or copper. Copper interconnect interconnects have been found to have good adhesion with CuSiN barrier layer layers. It is possible to have the interconnect 36 comprised of a conductive metal or metal alloy that has satisfactory adhesion with CuSiN.

An interconnect 36 comprised of copper can be formed by:

(1) forming a Cu seed layer over the CuSiN layer 30;

(2) forming a copper layer by a ECP process filling the interconnect opening;

(3) planarizing the copper layer using a chemical mechanical planarization process to form the copper interconnect 36.

Note that, preferably there is only the CuSiN barrier layer between the interconnect 36 and the dielectric layer 20. Also, note that preferably no Ta or Ta/TaN barrier layer is formed.

Figure 4:
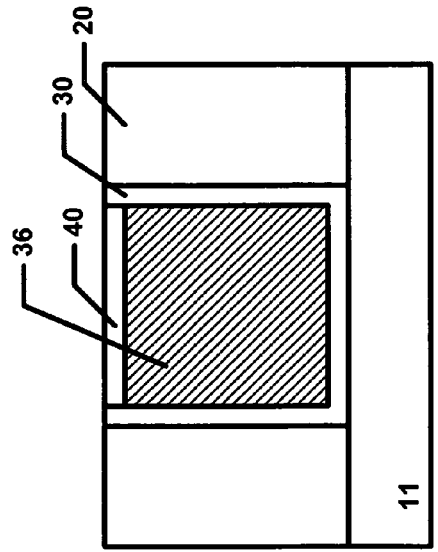
Figure 1:
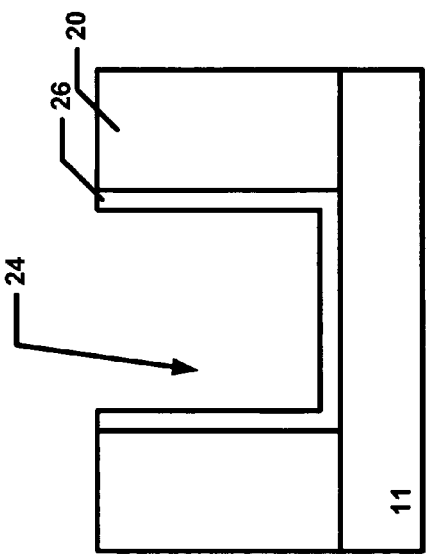
Figure 3:
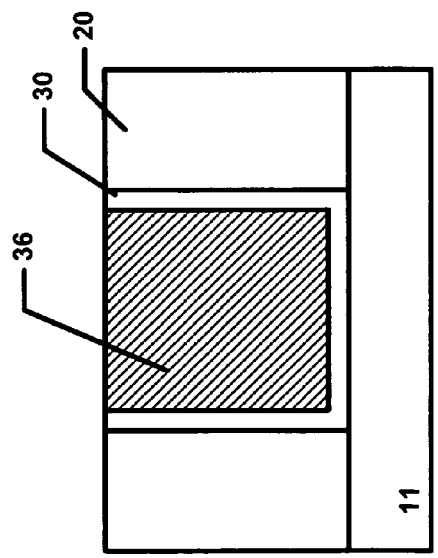

E. Forming a CuSiN Cap on the Top Surface of the Copper Interconnect;

Referring to FIG. 4, we can form a CuSiN cap 40 on the top surface of the copper interconnect 36.

The CuSiN cap 40 can be formed by a plasma process comprising $SiH_4$ and $NH_3$. For example the CuSiN cap can be formed by the n-containing process described above used to form the barrier layer 30.

The CuSiN cap 40 can have a thickness in the range between 20 and 200 angstroms.

The CuSiN cap 40 and the barrier layer 30 can encapsulate the interconnect 36.

F. Features

Some non-limiting features of some example embodiments are described below. The example embodiment's CuSiN barrier layer 30 can have a very thin "diffuse" layer between Cu interconnect 36 and the ILD layer 20 that will help to reduce the resistance. On top of resistance reduction, the embodiment's CuSiN layer can improve the adhesion, lower cost, simplicity of the process, uniform formation of CuSiN, suppression of Cu and O, and lower k effective value. The embodiments CuSiN barrier layer 30 has been found to increase the Rs is only about 1% as compared to Cu.

As embodiment's CuSiN barrier layer 30 is a self aligned process, the adhesion towards Cu is strong. For the Cu barrier properties, the CuSiN 30 performance is similar with dielectric having nitride incorporation causing it to have superior performance. Also, elimination of TaN/Ta barrier layer process add towards lower cost of this application. Elimination of TaN/Ta barrier layers that caused plasma damage issue on low k.

G. Non-limiting Example Embodiments

Although the method of the present invention is explained with reference to formation of an exemplary copper interconnect structure (feature) such as a trench line or via, it will be appreciated that the process may be equally as well used in forming copper dual damascene structures as well as thicker and wider structures such as bonding pads and wide trenches. The method is particularly advantageously used in the formation of copper damascene features such as vias and trench lines In addition, the method is particularly advantageously used with silicon oxide based low-K dielectric insulating layers having an interconnecting porous structure and having a dielectric constant of less than about 3.0 including less than about 2.5, for example from about 2.2 to about 3.0. Further, the term 'copper' will be understood to include copper, essentially copper and alloys thereof.

In the above description numerous specific details are set forth such as flow rates, pressure settings, thicknesses, etc., in order to provide a more thorough understanding of the present invention. Those skilled in the art will realize that power settings, residence times, gas flow rates are equipment specific and will vary from one brand of equipment to another. It will be obvious, however, to one skilled in the art that the present invention may be practiced without these details. In other instances, well known process have not been described in detail in order to not unnecessarily obscure the present invention. Also, the flow rates given can be scaled up or down using the flow ratios.

Given the variety of embodiments of the present invention just described, the above description and illustrations show not be taken as limiting the scope of the present invention defined by the claims.

While the invention has been particularly shown and described with reference to the preferred embodiments thereof, it will be understood by those skilled in the art that various changes in form and details may be made without departing from the spirit and scope of the invention. It is intended to cover various modifications and similar arrangements and procedures, and the scope of the appended claims therefore should be accorded the broadest interpretation so as to encompass all such modifications and similar arrangements and procedures.

What is claimed is:

1. A method of forming a barrier layer for an interconnect comprising the steps of:

providing an interconnect opening in a dielectric layer over a semiconductor structure;

forming a barrier layer comprising CuSiN over sidewalls and a bottom of the interconnect opening, wherein forming the barrier layer comprises forming copper using a low temperature process to reduce diffusion of copper into the dielectric layer; and forming an interconnect in the opening over the barrier layer.

2. The method of claim 1 which further comprises forming a CuSiN cap layer over said interconnect.

3. The method of claim 1 wherein the interconnect is formed by:

forming a Cu seed layer over said barrier layer;

forming a copper layer by an ECP process filling said interconnect opening; and planarizing said copper layer using a chemical mechanical planarization process to form said interconnect.

4. The method of claim 1 wherein said barrier layer is formed by a process comprising:

forming a first copper layer directly on the sidewalls of said dielectric layer; said first copper layer formed using an electrograft process or an ALD process at a temperature between about 25 and 100 degrees C.;

performing a soaking process in a silicon containing gas on said first copper layer; and performing a N-containing plasma treatment to consume the first copper layer to form the barrier layer comprised of CuSiN.

5. The method of claim 1 wherein said barrier layer is formed by a process comprising:

forming a first copper layer directly on the sidewalls of the dielectric layer; said first copper layer formed using an electrograft process or an ALD process at a temperature between about 25 and 100 degrees C.; said first copper layer having a thickness of less than 50 angstroms;

performing a SiH₄ soak process on the first copper layer comprising: a SiH₄ flow between about 50 and 250 sccm; a soak time between about 5 and 30 s; a N₂ flow between about 0 and 16000 sccm; at a temperature in the range of between about 200 and 350 degrees C.; and a pressure range about between 3 and 6 torr; and performing a NH₃ plasma treatment comprising: a NH₃ flow between about 150 and 1600 sccm; a plasma treatment time between about 5 and 30 s; an RF power between about 500 and 700 W; a temperature range between about 200 and 350 degrees C.; a pressure range between about 3 and 6 torr; and a N₂ flow between about 150 and 1600 sccm.

6. The method of claim 1 wherein the barrier layer consists essentially of CuSiN.

7. The method of claim 1 wherein the barrier layer consists essentially of CuSiN with Cu between 20 and 60 atomic %, Si between 25 and 45 atomic % and N between 5 and 20 atomic %.

8. The method of claim 1 wherein the interconnect is comprised of copper or a copper alloy.

9. The method of claim 1 wherein the interconnect is comprised of Cu and which further comprises forming a CuSiN cap over the interconnect by:

performing a soaking process in a silicon containing gas; and performing a N-containing plasma treatment.

10. The method of claim 1 wherein said barrier layer is formed by a process comprising:

forming a first copper layer directly on the sidewalls of the dielectric layer; said first copper layer formed at a temperature between about 25 and 100 degrees C.; and treating said first copper layer to consume the first copper layer to form the barrier layer comprised of CuSiN.

11. A method of forming a barrier layer for an interconnect comprising:

providing an interconnect opening in a dielectric layer over a semiconductor structure; said dielectric layer having sidewalls in the interconnect opening;

forming a barrier layer comprised of CuSiN over the sidewalls and a bottom of said interconnect opening 24;

said barrier layer is formed by a process comprising forming a first copper layer directly on the sidewalls of the dielectric layer; said first copper layer formed using an electrograft process or an ALD process at a temperature between about 25 and 100 degrees C., performing a soaking process in a silicon containing gas, and performing a N-containing plasma treatment wherein all of the first copper layer is consumed to form the barrier layer comprised of CuSiN;

forming an interconnect comprised of copper over said barrier layer; and forming a CuSiN cap layer over said interconnect.

12. The method of claim 11 wherein said barrier layer is formed by the process further comprising:

the soaking process comprises a SiH₄ soak process comprising: a SiH₄ flow between about 50 and 250 sccm; a soak time between about 5 and 30 s; a N₂ flow between about 0 and 16000 sccm; a temperature range between about 200 and 350 degrees C.; and a pressure range about between 3 and 6 torr; and the N-containing plasma treatment comprises a NH₃ plasma treatment comprising: a NH₃ flow between about 150 and 1600 sccm; a plasma treatment time between about 5 and 30 s; an RF power between about 500 and 700 W; a temperature range between about 200 and 350 degrees C.; a pressure range between about 3 and 6 torr; and a N₂ flow between about 150 and 1600 sccm.

13. The method of claim 11 wherein the barrier layer consists essentially of CuSiN with Cu between 20 and 60 atomic %, Si between 25 and 45 atomic % and N between 5 and 20 atomic %.

14. A device structure comprising:

an interconnect opening in a dielectric layer over a semiconductor structure;

a barrier layer comprising a copper based barrier material, the barrier layer lining the interconnect opening, wherein the copper based barrier material comprises CuSiN; and an interconnect disposed in the interconnect opening over said barrier layer.

15. The device structure of claim 14 which further comprises a copper-based cap layer over the interconnect.

16. The device structure of claim 15 wherein the cap layer comprises CuSiN.

17. The device structure of claim 14 wherein:

the interconnect comprises copper with a copper-based cap layer over the interconnect; and the barrier layer and the cap layer comprise CuSiN with Cu between 20 and 60 atomic %, Si between 25 and 45 atomic % and N between 5 and 20 atomic %.

18. The device structure of claim 14 which further comprises: said interconnect is comprised of copper; said barrier layer is directly on the sidewalls of the dielectric layer.

* * * * *